(12) United States Patent
Tsai et al.

(10) Patent No.: US 6,825,064 B2
(45) Date of Patent: Nov. 30, 2004

(54) MULTI-CHIP SEMICONDUCTOR PACKAGE AND FABRICATION METHOD THEREOF

(75) Inventors: Shiann-Tsong Tsai, Hsinchu (TW); Yu-Ming Hsu, Hsinchu (TW); Wen-Lung Wu, Hsinchu (TW); Kuen-Huang Chen, Hsinchu (TW); Wen-Sheng Su, Hsinchu (TW); Chin-Hsing Lin, Hsinchu (TW)

(73) Assignee: UltraTera Corporation (TW)

( * ) Notice: Subject to any disclaimer, the term of this patent is extended or adjusted under 35 U.S.C. 154(b) by 53 days.

(21) Appl. No.: 10/261,796

(22) Filed: Sep. 30, 2002

(65) Prior Publication Data

US 2004/0061146 A1 Apr. 1, 2004

(51) Int. Cl.[7] .............................................. H01L 21/44
(52) U.S. Cl. ...................... 438/107; 257/686; 257/678; 257/723; 257/777
(58) Field of Search ................................ 257/686, 678, 257/723, 777

(56) References Cited

U.S. PATENT DOCUMENTS 6,388,313 B1 * 5/2002 Lee et al. .................... 257/686
6,627,990 B1 * 9/2003 Shim et al. .................. 257/712

* cited by examiner

Primary Examiner—David Nelms
Assistant Examiner—Mai-Huong Tran
(74) Attorney, Agent, or Firm—Fulbright & Jaworski I

(57) ABSTRACT

A multi-chip semiconductor package and a fabrication method thereof are provided. A substrate having an upper surface and a lower surface is prepared. At least a first chip is mounted on the upper surface of the substrate. A non-conductive material is applied over predetermined area on the first chip and the upper surface of the substrate. At least a second chip is mounted on the non-conductive material, and formed with at least a suspending portion free of interference in position with the first chip, wherein the non-conductive material is dimensioned in surface area at least corresponding to the second chip, so as to allow the suspending portion to be supported on the non-conductive material. With the second chip being completely supported on the non-conductive material without causing a conventional chip-crack problem, structural intactness and reliability can be effectively assured for fabricated-package products.

10 Claims, 4 Drawing Sheets

MULTI-CHIP SEMICONDUCTOR PACKAGE AND FABRICATION METHOD THEREOF

FIELD OF THE INVENTION

The present invention relates to multi-chip semiconductor packages, and more particularly, to a semiconductor package with a plurality of chips mounted on a chip carrier, and a fabrication method of the semiconductor package.

BACKGROUND OF THE INVENTION

In favor of effective enhancement in electrical and operational performances, it preferably incorporates more than one or a plurality of chips in a single package, thus forming a multi-chip semiconductor package. A conventional multi-chip semiconductor package 1, as shown in FIG. 3, is a substrate-based structure, wherein a first chip 10 is mounted on a substrate 11 and electrically connected thereto by a plurality of first bonding wires 12. A second chip 13 is stacked on the first chip 10, and electrically connected to the substrate 11 by a plurality of second bonding wires 14. An encapsulant 15 is formed on the substrate 11, and encapsulates the first and second chips 10, 13 and the first and second bonding wires 12, 14. A plurality of solder balls 16 are implanted on the substrate 11 opposed in position to the encapsulant 15, and serve as input/output (I/O) ports for electrically connecting the first and second chips 10, 13 to an external device such as a printed circuit board (PCB, not shown). However, this multi-chip semiconductor package 1 is subject to a chip-size limitation problem; that is, the second chip 13 should be smaller in dimension than the first chip 10 so as not to interfere with arrangement of the first bonding wires 12 bonded to the first chip 10.

Accordingly, as shown in FIGS. 4A and 4B, another multi-chip semiconductor package 1' is provided for solving the above chip-size limitation problem, wherein the second chip 13 is stacked on the first chip 10 in a stagger manner, and thus partly in contact with the first chip 10. By this arrangement, the second chip 13 may be flexibly sized with respect to the first chip 10, and free of concern to interfere with the first bonding wires 12 connected to the first chip 10. However, with partial or incomplete contact between the first and second chips 10, 13, the second chip 13 is formed with at least a suspending portion 130 that lacks support from the first chip 10, with bond pads 131 of the second chip 13, where the second bonding wires 14 are bonded, being situated at the suspending portion 130. During a wire-bonding process for forming the second bonding wires 14, a wire bonder (not shown) exerts a strong force toward the bond pads 131, and thus may lead to cracks of the second chip 13 at the suspending portion 130 that is not supported by the first chip 10.

In response to the above chip-crack problem, a further multi-chip semiconductor package 1", as shown in FIG. 5, teaches to form a plurality of support members 17 interposed between the suspending portion 130 and the substrate 11. The support members 17 are situated substantially correspondingly in position to the bond pads 131 of the second chip 13 where the second bonding wires 14 are bonded, and used to enhance mechanical strength or support for the second chip 13 and at the suspending portion 130. As a result, the second chip 13 may become stronger against the wire-bonding force without easily cracking at the suspending portion 130 during formation of the second bonding wires 14.

However, the above multi-chip semiconductor package 1" in the use of the support members 17, induces significant problems. One is void or popcorn effect issues; the support members 17 are arranged to undesirably form gaps G between the first chip 10 and the support members 17. During a molding process for forming the chip-encapsulation encapsulant 15 by a resin compound, the relative narrow gaps G would change motion of the resin compound passing therethrough and easily trap air or voids therein; this may lead to popcorn effect with voids left in the encapsulant 15 for the semiconductor package 1" in subsequent fabrication processes, and thereby adversely affect reliability of fabricated package products.

SUMMARY OF THE INVENTION

An objective of the present invention is to provide a multi-chip semiconductor package and a fabrication method thereof, which can prevent a chip accommodated in the semiconductor package from cracking during fabrication processes.

Another objective of the invention is to provide a multi-chip semiconductor package and a fabrication method thereof, wherein no gap is formed between a non-conductive material and a chip applied with the non-conductive material, such that no void or popcorn effect issue is generated.

A further objective of the invention is to provide a multi-chip semiconductor package and a fabrication method thereof, which can enhance mechanical strength for a chip and help minish thermal stress exerted to the chip, and also, the chip can be further thinned in favor of reducing overall package thickness.

A further objective of the invention is to provide a multi-chip semiconductor package and a fabrication method thereof, wherein a non-conductive material is applied over a chip and helps prevent external moisture from invading the chip, thereby assuring reliability of the semiconductor package.

In accordance with the above and other objectives, the present invention proposes a multi-chip semiconductor package, comprising: a substrate having an upper surface and a lower surface opposed to the upper surface; at least a first chip mounted on the upper surface of the substrate; a non-conductive material applied over predetermined area on the first chip and the upper surface of the substrate; at least a second chip mounted on the non-conductive material, and formed with at least a suspending portion free of interference in position with the first chip, wherein the non-conductive material is dimensioned in surface area at least corresponding to the second chip, so as to allow the suspending portion to be supported on the non-conductive material; and an encapsulant formed on the upper surface of the substrate for encapsulating the first and second chips.

A method for fabricating the above multi-chip semiconductor package comprises the steps of: preparing a substrate having an upper surface and a lower surface opposed to the upper surface; mounting at least a first chip on the upper surface of the substrate; applying a non-conductive material over predetermined area on the first chip and the upper surface of the substrate; mounting at least a second chip on the non-conductive material, wherein the second chip is formed with at least a suspending portion free of interference in position with the first chip, and the non-conductive material is dimensioned in surface area at least corresponding to the second chip, so as to allow the suspending portion to be supported on the non-conductive material; and forming an encapsulant on the upper surface of the substrate for encapsulating the first and second chips.

The above semiconductor package provides significant benefits First, as the second chip is completely supported on the non-conductive material, during a wire-bonding process for forming the second bonding wires, the suspending portion of the second chip can be prevented from cracking in response to wire-bonding force exerted by a wire bonder, thereby assuring structural intactness of the second chip. Further, as the non-conductive material is directly applied over the first chip without forming gaps therebetween, no void or popcorn effect issue is concerned in this invention for fabricating the encapsulant. Moreover, the second chip is attached with one side thereof to the non-conductive material such as an elastic adhesive, and encapsulated with its opposed side by the encapsulant; this double-side encapsulation enhances mechanical strength and provides buffer effect for the second chip, and helps reduce thermal stress exerted to the second chip during subsequent high-temperature conditions, and also, the second chip can thereby be further thinned in favor of reducing overall package thickness. Furthermore, the non-conductive material applied over the first chip helps prevent external moisture from invading the first chip, thereby assuring reliability of the semiconductor package.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments for a multi-chip semiconductor package and a fabrication method thereof proposed in the present invention are described in more detail as follows with reference to FIGS. 1A–1F and 2A–2D.
First Preferred Embodiment FIGS. 1A–1F illustrate fabrication processes for a semiconductor package 2 according to a first embodiment of the invention.

Figure 1A:
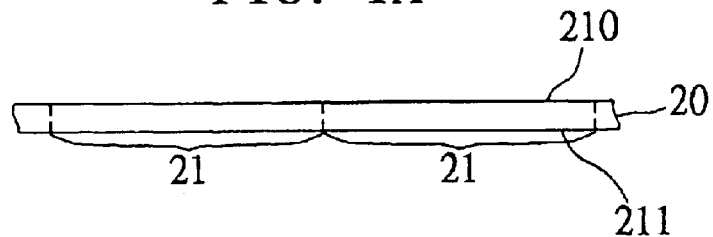
FIGS. 1A–1F are schematic diagrams showing fabrication processes for a semiconductor package according to a first preferred embodiment of the invention.

Referring to FIG. 1A, the first step is to prepare a substrate plate 20 integrally formed of a plurality of substrates 21, which are bordered by dotted lines shown in the drawing. Each of the substrates 21 has an upper surface 210 and a lower surface 211 opposed to the upper surface 210. The substrate plate 20 is primarily made of a conventional resin material, such as epoxy resin, polyimide, BT (bismaleimide triazine) resin, FR-4 resin, etc.

Figure 1B:
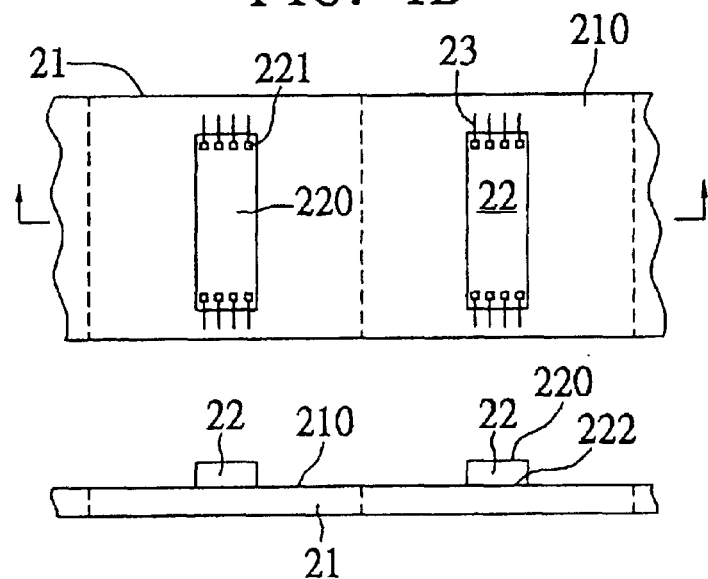

Referring to FIG. 1B, the next step is to mount at least a first chip 22 on the upper surface 210 of each of the substrates 21. The first chip 22 has an active surface 220 where a plurality of electronic elements and circuits (not shown) and bond pads 221 are formed, and a non-active surface 222 opposed to the active surface 220, wherein the non-active surface 222 of the first chip 22 is attached to the upper surface 210 of the corresponding one of the substrates 21.

Then, a wire-bonding process is performed to form a plurality of first bonding wires 23 such as gold wires, which are bonded to the bond pads 221 on the active surface 220 of the first chip 22 and to the upper surface 210 of the corresponding substrate 21, so as to allow the first chip 22 to be electrically connected to the substrate 21 by the first bonding wires 23.

Figure 1C:
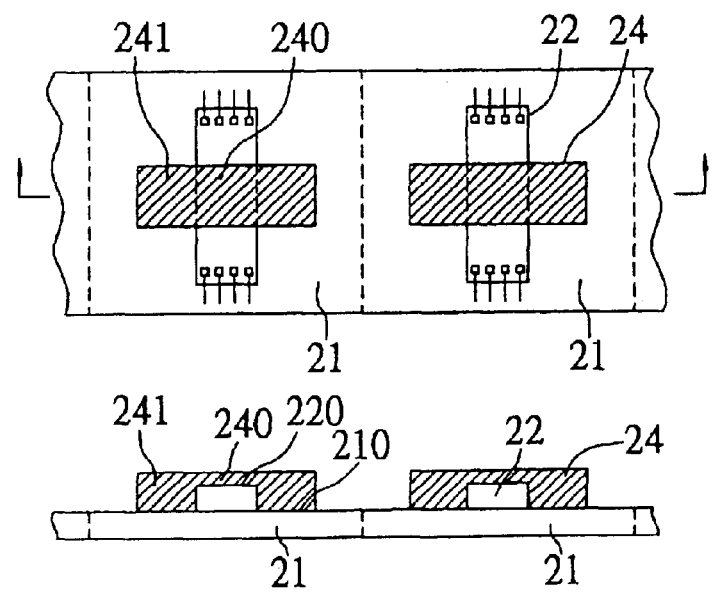

Referring to FIG. 1C, a non-conductive material 24 such as an elastic adhesive is applied over predetermined area on each of the first chips 22 and the substrates 21, and arranged in a stagger manner with respect to the corresponding one of the first chips 22, wherein the non-conductive material 24 has a chip contact portion 240 formed on the active surface 220 of the corresponding first chip 22, and at least a substrate contact portion 241 formed on the upper surface 210 of the corresponding one of the substrates 21. The non-conductive material 24 is dimensioned in surface area at least corresponding to a second chip (not shown) to be subsequently mounted thereon in a stagger manner with respect to the first chip 22.

Application of the non-conductive material 24 may be implemented by a stencil-printing process, wherein a conventional stencil (not shown) is employed for allowing the non-conductive material (elastic adhesive) 24 to be selectively printed over the predetermined area on the first chips 22 and the substrates 21. Since stencil-printing technology is conventional in the art, it is not to be further detailed herein. Moreover, conventional dispensing technology may also be adopted for applying the non-conductive material 24. It should be understood that, other techniques or processes suitable for use with the non-conductive material 24 are encompassed within the scope of this invention.

Figure 1D:
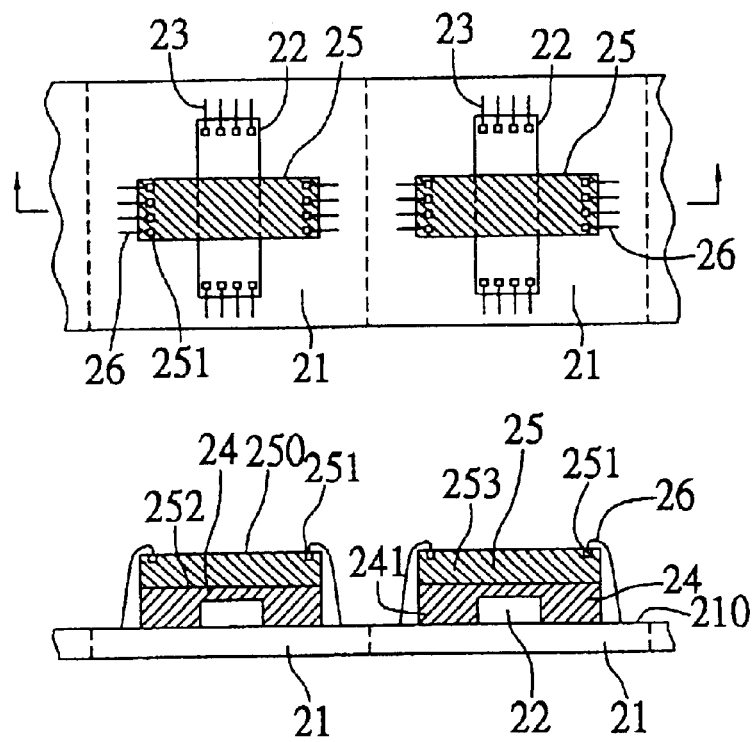

Referring to FIG. 1D, at least a second chip 25 is mounted on the non-conductive material 24 and positioned above each of the first chips 22. The second chip 25 has an active surface 250 where a plurality of electronic elements and circuits (not shown) and bond pads 251 are formed, and a non-active surface 252 opposed to the active surface 250, wherein the non-active surface 252 of the second chip 25 is attached to and completely supported on the non-conductive material 24 corresponding in surface area to the second chip 25. The second chip 25 aligned with the non-conductive material 24 is also arranged in a stagger manner with respect to the corresponding one of the first chips 22, such that at least a suspending portion 253, free of interference in position with the corresponding first chip 22, of the, second chip 25 can be firmly supported on the substrate contact portion 241 of the non-conductive material 24

Then, a wire-bonding process is performed to form a plurality of second bonding wires 26 such as gold wires, which are bonded to the bond pads 251 on the active surface 250 of the second chip 25 and to the upper surface 210 of the corresponding one of the substrates 21, such that the second chip 25 may be electrically connected to the corresponding substrate 21 by the second bonding wires 26.

Figure 1E:
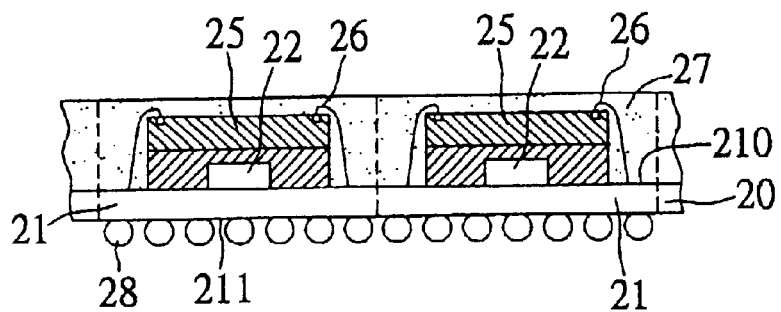

Referring to FIG. 1E, a molding process is implemented to form an encapsulant 27 on the upper surfaces 210 of the substrates 21, and the encapsulant 27 encapsulates the first and second chips 22, 25, the first bonding wires 23 (as shown in FIG. 1D) and the second bonding wires 26, in an effort to protect these encapsulated components against external moisture and contaminants. The encapsulant 27 is made of a conventional resin compound, such as epoxy resin.

Then, a ball-implantation process is performed to bond a plurality of solder balls 28 on the lower surfaces 211 of the substrates 21. The solder balls 28 may serve as input/output (I/O) ports for electrically connecting the first and second chips 22, 25 to an external device such as printed circuit board (PCB, not shown).

Figure 1F:
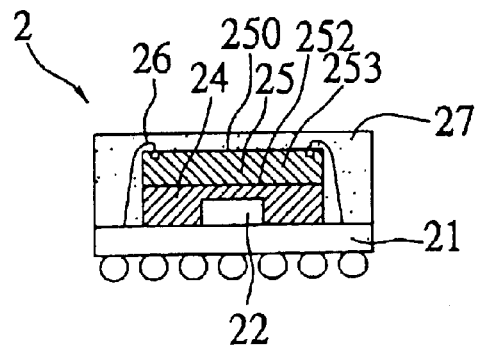

Referring to FIG. 1F, finally a singulation process is carried out to cut through the encapsulant 27 and the substrate plate 20 along dotted lines shown in FIG. 1E, so as to separate apart the substrates 21 and form a plurality of individual semiconductor packages 2.

Second Preferred Embodiment

FIGS. 2A–2D illustrate fabrication processes for a semiconductor package 2' according to a second preferred embodiment of the invention. This semiconductor package 2' is structurally similar to the above semiconductor package 2 of the first preferred embodiment; therefore, same components are here designated with same reference numerals as those used in the above first embodiment for easy interpretation and illustration.

Figure 2A:
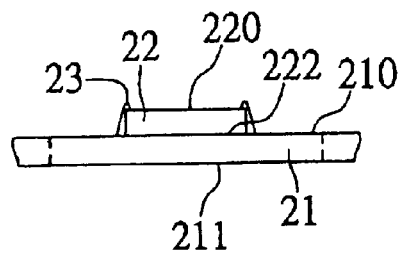
FIGS. 2A–2D are schematic diagrams showing fabrication processes for a semiconductor package according to a second preferred embodiment of the invention.

Referring to FIG. 2A, the first step is to prepare a substrate 21 having an upper surface 210 and a lower surface 211 opposed to the upper surface 210. At least a first chip 22 is mounted on the upper surface 210 of the substrate 21; the first chip 22 has an active surface 220 and a non-active surface 222 opposed to the active surface 220, wherein the non-active surface 222 of the first chip 22 is attached to the upper surface 210 of the substrate 21. A plurality of first bonding wires 23 such as gold wires are formed to electrically connect the active surface 220 of the first chip 22 to the upper surface 210 of the substrate 21.

Figure 2B:
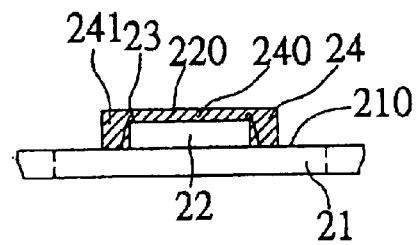

Referring to FIG. 2B, a non-conductive material 24 such as an elastic adhesive is applied by stencil-printing or dispensing technology over predetermined area on the first chip 22 and the substrate 21, and arranged substantially in a parallel manner with respect to the first chip 22, wherein the non-conductive material 24 has a chip contact portion 240 formed on the active surface 220 of the first chip 22, and at least a substrate contact portion 241 formed on the upper surface 210 of the substrate 21. The non-conductive material 24 is dimensioned in surface area at least corresponding to a second chip (not shown) to be subsequently mounted thereon in a parallel manner with respect to the first chip 22. The chip contact portion 240 of the non-conductive material 24 may be dimensioned to entirely or partly cover the active surface 220 of the first chip 22; in the former case, the non-conductive material 24 is formed for accommodating the second chip that is larger in surface area than the first chip 22. And, the non-conductive material 24 is adapted to at least partly cover the first bonding wires 23 bonded to the first chip 22.

Figure 2C:
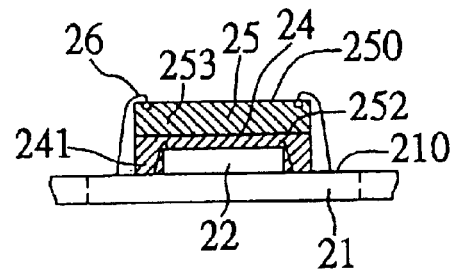

Referring to FIG. 2C, at least a second chip 25 is mounted on the non-conductive material 24 and positioned above the first chip 22. The second chip 25 has an active surface 250 and a non-active surface 252 opposed to the active surface 250, wherein the non-active surface 252 of the second chip 25 is attached to and completely supported on the non-conductive material 24 corresponding in surface area to the second chip 25. The second chip 25 aligned with the non-conductive material 24 is also arranged in a parallel manner with respect to the first chip 22, such that at least a suspending portion 253, free of interference in position with the first chip 22, of the second chip 25 can be firmly supported on the substrate contact portion 241 of the non-conductive material 24. Then, a plurality of second bonding wires 26 such as gold wires are formed for electrically connecting the active surface 250 of the second chip 25 to the upper surface 210 of the substrate 21.

Figure 2D:
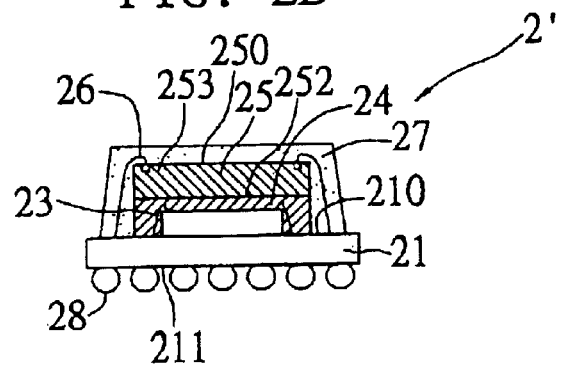
Figure 3:
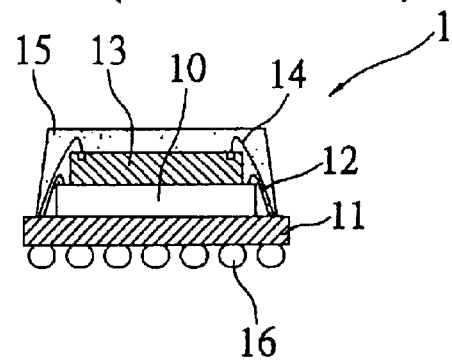
FIG. 3 (PRIOR ART) is a cross-sectional view of a conventional semiconductor package.
Figure 4A:
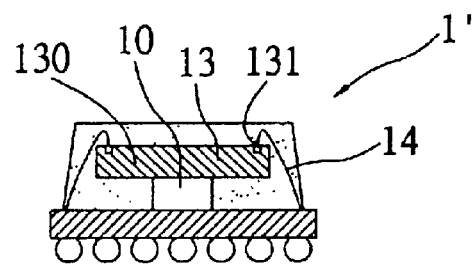
FIG. 4A (PRIOR ART) is a cross-sectional view of another conventional semiconductor package.
Figure 4B:
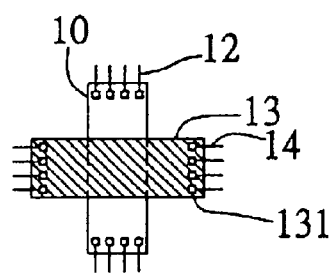
FIG. 4B (PRIOR ART) is a top view showing chip arrangement of the semiconductor package shown in FIG. 4A.
Figure 5:
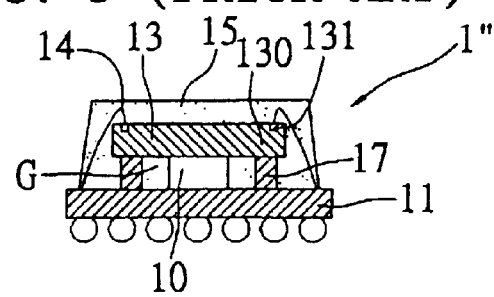
FIG. 5 (PRIOR ART) is a cross-sectional view of a further conventional semiconductor package.

Referring to FIG. 2D, an encapsulant 27 is formed on the upper surface 210 of the substrate 21 for encapsulating the first and second chips 22, 25 and the first and second bonding wires 23, 26, whereby these encapsulated components are protected against external moisture and contaminants. Then, a plurality of solder balls 28 are implanted on the lower surface 211 of the substrate 21, and serve as I/O ports for electrically connecting the first and second chips 22, 25 to an external device such as printed circuit board (PCB, not shown). This completes fabrication of the semiconductor package 2'.

It should be understood that, the second chip 25 can be applied with the non-conductive material 24 if necessary for accommodating more chips thereon.

The above semiconductor packages 2, 2' provide significant benefits. First, as the second chip 25 is completely supported on the non-conductive material 24, during the wire-bonding process for forming the second bonding wires 26, the suspending portion 253 of the second chip 25 can be prevented from cracking in response to wire-bonding force exerted by a wire bonder, thereby assuring structural intactness of the second chip 25. Further, as the non-conductive material 24 is directly applied over the first chip 22 without forming gaps therebetween, no void or popcorn effect issue is concerned in this invention for fabricating the encapsulant 27. Moreover, the non-active surface 252 of the second chip 25 is attached to the non-conductive material 24 such as an elastic adhesive, and the opposed active surface 250 of the second chip 25 is encapsulated by the encapsulant 27; this double-side encapsulation enhances mechanical strength for the second chip 25, and the elastic non-conductive material 24 provides buffer effect for helping reduce thermal stress exerted from the encapsulant 27 to the second chip 25 during subsequent high-temperature conditions, and also, the second chip 25 can be further thinned in favor of reducing overall package thickness. Furthermore, as shown in FIG. 2B, the non-conductive material 24 at least partly covers the first bonding wires 23 bonded to the first chip 22, which helps secure the first bonding wires 23 in position without being subject to wire sweeping in response to mold flow impact generated during formation of the encapsulant 27. In addition, further referring to FIG. 2B, as the non-conductive material 24 may partly or entirely cover the first chip 22, it helps prevent external moisture from invading the first chip 22 and thus assure reliability of the semiconductor packages 2, 2'.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A fabrication method of a multi-chip semiconductor package, comprising the steps of:

preparing a substrate having an upper surface and a lower surface opposed to the upper surface;

mounting at least a first chip on the upper surface of the substrate;

applying a non-conductive material over predetermined area on the first chip and the upper surface of the substrate;

mounting at least a second chip on the non-conductive material, wherein the second chip is formed with at least a suspending portion free of interference in position with the first chip, and the non-conductive material having a chip contact portion formed on an upper surface of the first chip and at least a substrate contact portion formed on the upper surface of the substrate, the non-conductive material is dimensioned in surface area at least corresponding to the second chip, so as to allow the suspending portion to be supported directly on the substrate contact portion of the non-conductive material; and forming an encapsulant on the upper surface of the substrate for encapsulating the first and second chips.

2. The fabrication method of claim 1, further comprising a step of: implanting a plurality of solder balls on the lower surface of the substrate.

3. The fabrication method of claim 1, wherein the non-conductive material is an elastic adhesive.

4. The fabrication method of claim 1, wherein the non-conductive material is interposed between the first and second chips.

5. The fabrication method of claim 1, wherein the second chip is arranged in a stagger manner with respect to the first chip.

6. The fabrication method of claim 1, wherein the second chip is arranged in a parallel manner with respect to the first chip.

7. The fabrication method of claim 1, wherein the second chip is larger in surface area than the first chip.

8. The fabrication method of claim 1, wherein the non-conductive material is applied by printing technology.

9. The fabrication method of claim 1, wherein the non-conductive material is applied by dispensing technology.

10. The fabrication method of claim 1, wherein the first and second chips are each electrically connected to the substrate by a plurality of bonding wires.

* * * * *